US012793791B2

(12) United States Patent
Liu et al.

(10) Patent No.: US 12,793,791 B2
(45) Date of Patent: Nov. 10, 2026

(54) DUAL READ MODE NON-VOLATILE MEMORY SEMICONDUCTOR DEVICE

(71) Applicant: Silicon Storage Technology, Inc., San Jose, CA (US)

(72) Inventors: Xian Liu, Sunnyvale, CA (US); Simone Bartoli, Lecco (IT); Stefano Sivero, Comun Nuovo BG (IT); Stefano Surico, Bussero (IT); Giuseppe Moioli, Alzano Lombardo (IT); Lorenzo Bedarida, Vimercate (IT); Jean Francois Thiery, Caromb Vaucluse (FR); Serguei Jourba, Aix en Provence (FR); Catherine Decobert, Pourrieres (FR); Nhan Do, Saratoga, CA (US); Jinho Kim, Saratoga, CA (US); Latt Tee, San Francisco, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 116 days.

(21) Appl. No.: 19/035,813

(22) Filed: Jan. 23, 2025

(65) Prior Publication Data

US 2026/0134927 A1 May 14, 2026

Related U.S. Application Data

(60) Provisional application No. 63/720,652, filed on Nov. 14, 2024.

(51) Int. Cl.
*G11C 16/04* (2006.01)
*G11C 16/10* (2006.01)
*G11C 16/28* (2006.01)

(52) U.S. Cl.
CPC ............ *G11C 16/28* (2013.01); *G11C 16/102* (2013.01)

(58) Field of Classification Search
CPC .............................. G11C 16/28; G11C 16/102
See application file for complete search history.

(56) References Cited

U.S. PATENT DOCUMENTS 5,029,130 A 7/1991 Yeh
6,855,980 B2 2/2005 Wang et al.
(Continued)

OTHER PUBLICATIONS

PCT Search Report and Written Opinion mailed on Jul. 24, 2025 corresponding to the related PCT Patent Application No. PCT/US2025/022171.

*Primary Examiner* — Pho M Luu
(74) *Attorney, Agent, or Firm* — DLA Piper LLP (US)

(57) ABSTRACT

A method of operating a semiconductor device having a plurality of memory cells programmable to a plurality of program states, wherein each of the program states is associated with a range of read currents bounded by a pair of reference read currents, comprising storing data by programming a first memory cell of the plurality of memory cells to a first program state of the plurality of program states, and programming a second memory cell of the plurality of memory cells to a second program state of the plurality of program states; and reading the data by reading the first memory cell to determine a first read current through the first memory cell, reading the second memory cell to determine a second read current through the second memory cell, and comparing the first read current, the second read current and a first one of the reference read currents to each other.

28 Claims, 8 Drawing Sheets

(56) References Cited

U.S. PATENT DOCUMENTS

| | | | | |
|---|---|---|---|---|
| 7,315,056 | B2 | 1/2008 | Klinger | |
| 7,868,375 | B2 | 1/2011 | Liu et al. | |
| 2010/0165712 | A1* | 7/2010 | Bedeschi | G11C 11/5678 365/163 |
| 2013/0279266 | A1 | 10/2013 | Wang | |
| 2018/0068721 | A1 | 3/2018 | Calvetti | |
| 2019/0114097 | A1 | 4/2019 | Tran | |
| 2023/0386592 | A1* | 11/2023 | Vincenzi | G11C 7/14 |
| 2025/0022499 | A1* | 1/2025 | Ambrosi | G11C 11/1677 |

* cited by examiner

DUAL READ MODE NON-VOLATILE MEMORY SEMICONDUCTOR DEVICE

RELATED APPLICATIONS

This application claims the benefit of U.S. Provisional Application No. 63/720,652, filed Nov. 14, 2024, and which is incorporated herein by reference.

FIELD OF THE INVENTION

The present invention relates to non-volatile memory of semiconductor devices.

BACKGROUND OF THE INVENTION

Split-gate non-volatile memory semiconductor devices are well known in the art. See for example U.S. Pat. No. 7,868,375, which discloses a four-gate memory cell configuration, and which is incorporated herein by reference for all purposes. Specifically, FIG. 1 of the present disclosure illustrates a pair of split gate non-volatile memory cells 10 each with spaced apart source and drain regions 14/16 formed in a silicon semiconductor substrate 12. The source region 14 can be referred to as a source line SL (because it commonly is connected to other source regions for other non-volatile memory cells 10 in the same row or column), and the drain region 16 is commonly connected to a bit line. A channel region 18 of the substrate 12 extends between the source/drain regions 14/16. A floating gate 20 is disposed over (i.e., vertically over and laterally overlapping) and insulated from (and directly controls the conductivity of) a first portion of the channel region 18 (and partially over, and insulated from, the source region 14). A control gate 22 is disposed over, and insulated from, the floating gate 20. A select gate 24 (also referred to as a word line gate) is disposed over, and insulated from, and directly controls the conductivity of, a second portion of the channel region 18. An erase gate 26 is disposed over and insulated from the source region 14 and is laterally adjacent to the floating gate 20. The erase gate 26 can include a notch that faces an edge of the floating gate 20.

A plurality of such memory cells 10 can be arranged in rows and columns to form a memory cell array, as illustrated in FIG. 2. While FIG. 1 only shows a pair of memory cells 10 (sharing a common source region 14 and erase gate 26), the memory cell pairs can be placed end to end to form a column of memory cells 10 (where the memory cell pairs can share a common drain region 16). While only two such columns are shown in FIG. 2, there can be many such columns. Each column can include a bit line 16*a* electrically connecting together all the drain regions 16 in the column. Each row of memory cells 10 can include a control gate line 22*a* electrically connecting together all the control gates 22 in the row of memory cells 10. For example, all the control gates 22 in each row of memory cells 10 can be formed as a continuous line of conductive material, where a portion of the continuous line passing through any given memory cell 10 serves as its control gate 22. Each row of memory cells 10 can include a select gate line 24*a* electrically connecting together all the select gates 24 in the row of memory cells 10. For example, all the select gates 24 in each row of memory cells 10 can be formed as a continuous line of conductive material, where a portion of the continuous line passing through any given memory cell 10 serves as its select gate 24. Each row of memory cell pairs can include an erase gate line 26*a* electrically connecting together all the erase gates 26 in the row of memory cell pairs. For example, all the erase gates 26 in each row of memory cell pairs can be formed as a continuous line of conductive material, where a portion of the continuous line passing through any given memory cell pair serves as its erase gate 26. Finally, each row of memory cell pairs can include a source line 14*a* electrically connecting together all the source regions 14 in the row of memory cell pairs. For example, all the source regions 14 in each row of memory cell pairs can be formed as a continuous line of conductive diffusion in the substrate 12, where a portion of the continuous line passing through any given memory cell pair serves as its source region 14.

Various combinations of voltages are applied to the control gate 22, select gate 24, erase gate 26 and source and drain regions 14/16, to program the split gate non-volatile memory cell 10 (i.e., inject electrons onto the floating gate 20), to erase the split gate non-volatile memory cell 10 (i.e., remove electrons from the floating gate 20), and to read the split gate non-volatile memory cell 10 (i.e., measure or detect the conductivity of the channel region 18, by for example measuring or detecting a electrical current through the channel region 18 during a read operation (referred to herein as read current RC), to determine the program state of the floating gate 20).

Split gate non-volatile memory cell 10 can be operated in a digital manner, where the split gate non-volatile memory cell 10 is set to one of only two possible states: a programmed state and an erased state. The split gate non-volatile memory cell 10 is erased by placing a high positive voltage on the erase gate 26, and optionally a negative voltage on the control gate 22, to induce tunneling of electrons from the floating gate 20 to the erase gate 26 (leaving the floating gate 20 in a more positively charged state—the erased state). Split gate non-volatile memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate 20 in a more negatively charged state—the programmed state).

Split gate non-volatile memory cell 10 can be read in a read operation by placing positive voltages on the select gate 24 (turning on the portion of channel region 18 under the select gate 24 by making it conductive) and drain region 16 (and optionally on the erase gate 26 and the control gate 22), and sensing the read current RC flowing through the channel region 18. If the floating gate 20 is positively charged (i.e. split gate non-volatile memory cell 10 is erased), the split gate non-volatile memory cell 10 will turn on because the both portions of the channel region 18 are conductive due to the lack of electrons on the floating gate 20 (and capacitive coupling from the control gate 22), and read current RC will flow from drain region 16 to source region 14 (i.e. the split gate non-volatile memory cell 10 is sensed to be in its erased "1" state based on sensed current flow). If the floating gate 20 is negatively charged (i.e. split gate non-volatile memory cell 10 is programmed), the portion of channel region 18 under the floating gate is turned off (low conductivity), thereby preventing appreciable read current flow (i.e., the split gate non-volatile memory cell 10 is sensed to be in its programmed "0" state based on no, or minimal, current flow). Memory cells 10 are considered non-volatile because they maintain their program state even when power is not applied to the semiconductor device. Memory cells 10 can be referred to as split gate non-volatile memory cells because two different gates (floating gate 20 and select gate 24), respectively, directly control the conductivity of two different portions of the channel region 18.

Split gate non-volatile memory cell 10 can alternately be operated in an analog manner where the program state (i.e. the amount of charge, such as the number of electrons, on the floating gate 20) of the split gate-non-volatile memory cell 10 can be incrementally changed anywhere from a fully erased state (minimum number of electrons on the floating gate 20) to a fully programmed state (maximum number of electrons on the floating gate 20), or just a portion of this range. This means the split gate non-volatile memory cell 10 storage is analog, which allows for very precise and individual tuning of each split gate non-volatile memory cell 10 in an array of split gate non-volatile memory cells 10.

Alternatively, the split gate non-volatile memory cell 10 could be operated as an MLC (multilevel cell) where it is configured to be programmable to one of many discrete values (such as 4, 8, 16 or 64 different values). These different values can be referred to as program states. FIG. 3 show the program states for a memory cell storing 2 bits (i.e., using four possible program states) as a function of read current RC (i.e., the electrical current through the channel region 18 during a read operation). The program and erase operations result in a distribution of read current RC for each program state given these operations are not perfectly precise. The fully erased program state 11 (i.e., with the fewest electrons on the floating gate 20) provides the highest read current RC. Conversely, the fully programmed state 01 (i.e., with the most electrons on the floating gate 20) provides the lowest read current RC. As used herein, the higher the number of electrons on the floating gate, the higher the program state. Therefore, the fully programmed state 01 is the highest program state, and the fully erased state 11 is the lowest program state. During read operations, memory cells having a read current RC less than a first reference read current REF A (i.e., between REF 0 and REF A) can be identified as the fully programmed state 01. Memory cells having a read current RC less than a second reference read current REF B but greater than the first reference read current REF A (i.e., between REF A and REF B) can be identified as the next lower program state 00. Memory cells having a read current RC less than a third reference read current REF C but greater than the second reference read current REF B (i.e., between REF B and REF C) can be identified as the next lower program state 10. Memory cells having a read current RC greater than the third reference read current REF C (i.e., between REF C and REF D) can be identified as the next program state 11 (in this case the erased state 11). Therefore, each of the program states is associated with a range of read currents RC bounded by a pair of the reference read currents REF. The program states are different from each other in that the range of read currents RC associated with any one program state is different from the range of read currents RC associated with another one of the program states.

It should be noted that for the example of FIG. 3, reference currents REF 0 and REF D may not be needed to identify the 01 and 11 program states respectively given there is no program state higher than the program state 01, and there is no program state lower than program state 11. The reference read currents REF A, REF B, REF C can be provided by current sources such as reference memory cells, which are compared with the read currents RC from the memory cells being read to determine their program states.

Split gate non-volatile memory cells with fewer gates are also known. For example, FIG. 4 illustrates known split gate non-volatile memory cells 10 that are the same as that of FIG. 1, except the control gates 22 are omitted. See for example U.S. Pat. No. 7,315,056, which is incorporated herein by reference for all purposes. Voltage coupling to the floating gate 20 provided by the control gate 22 of the split gate non-volatile memory cell 10 of FIG. 1 is provided instead by the erase gate 26 and source region 14 of the split gate non-volatile memory cell 10 in FIG. 4. FIG. 5 illustrates an example layout of an array of the split gate non-volatile memory cells 10 of FIG. 4.

As another example, FIG. 6 illustrates known split gate non-volatile memory cells 10 that are similar to that of FIG. 1, except the control gates 22 and the erase gates 26 are omitted. See for example U.S. Pat. No. 5,029,130, which is incorporated herein by reference for all purposes. The erase voltage for the split gate non-volatile memory cell 10 of FIG. 6 is applied to the select gate 24, which has a first portion laterally adjacent the floating gate 20, and a second portion that extends up and over the floating gate 20. FIG. 7 illustrates an example layout of an array of the split gate non-volatile memory cells 10 of FIG. 6.

As yet another example, FIG. 8 illustrates known split gate non-volatile memory cells 10 that are similar to that of FIG. 6, except a conductive block of material 28 is formed in contact with source region 14, to serve as an extended source line. See for example U.S. Pat. No. 6,855,980, which is incorporated herein by reference for all purposes. An example layout for an array of the split gate non-volatile memory cells 10 of FIG. 8 can be the same as that in FIG. 7.

The advantage of multilevel cells (MLC) is that more bits of information can be stored in each memory cell. In the example of FIG. 3, four possible program states means two logic bits of information can be stored in each memory cell. One issue with multilevel cells (MLC) is that the more program state levels there are, the closer the program distributions are to the reference read currents used as program state boundaries to read the memory cells. Specifically, the smaller margins between the edges of the program distributions and the respective reference read currents means a greater chance a memory cell programmed to one program state might be read as being in a neighboring program state, causing a read error. For example, if the program state distributions drift over time due to phenomena such as charge loss (where electrons leak off the floating gate), read errors can occur. Another issue with non-volatile memory is that if the data stored in the memory cells needs to be changed/updated, the data cannot be read and used by the application utilizing the memory array until the change/update is completed. There is a need to address both of these issues.

BRIEF SUMMARY OF THE INVENTION

The aforementioned problems and needs are addressed by a method of operating a semiconductor device having a plurality of memory cells programmable to a plurality of program states, wherein each of the program states is associated with a range of read currents bounded by a pair of reference read currents. The method comprises storing data by programming a first memory cell of the plurality of memory cells to a first program state of the plurality of program states, and programming a second memory cell of the plurality of memory cells to a second program state of the plurality of program states, wherein the second program state is different than the first program state; and reading the data by reading the first memory cell to determine a first read current through the first memory cell, reading the second memory cell to determine a second read current through the second memory cell, and comparing the first read current, the second read current and a first one of the reference read currents to each other.

A semiconductor device comprises a plurality of memory cells programmable to a plurality of program states, wherein each of the program states is associated with a range of read currents bounded by a pair of reference read currents, and control circuitry to: store data by program a first memory cell of the plurality of memory cells to a first program state of the plurality of program states, and program a second memory cell of the plurality of memory cells to a second program state of the plurality of program states, wherein the second program state is different than the first program state; and read the data by read the first memory cell to determine a first read current through the first memory cell, read the second memory cell to determine a second read current through the second memory cell, and compare the first read current, the second read current and a first one of the reference read currents to each other.

Other objects and features of the present disclosure will become apparent by a review of the specification, claims and appended figures.

DETAILED DESCRIPTION OF THE INVENTION

Figure 2:
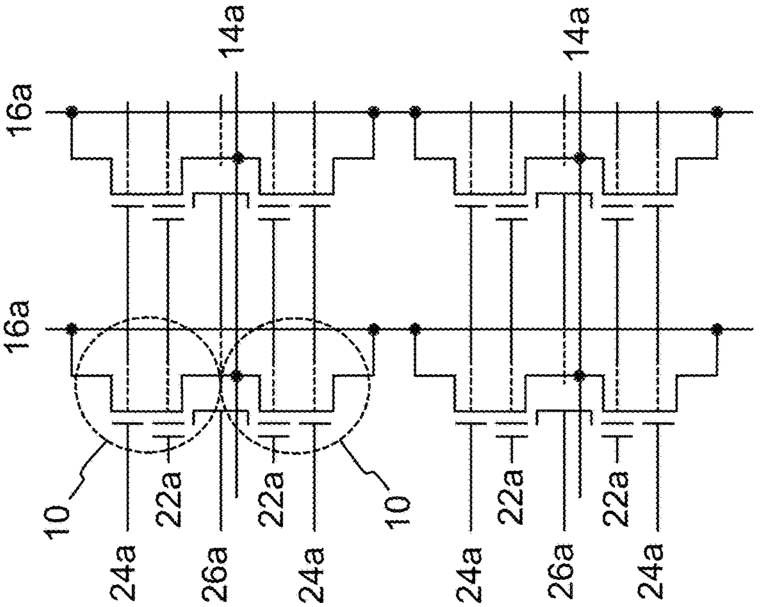
FIG. 2 (Prior Art)
FIG. 2 is a schematic and layout diagram of a conventional memory cell array of the memory cells of FIG. 1.
Figure 1:
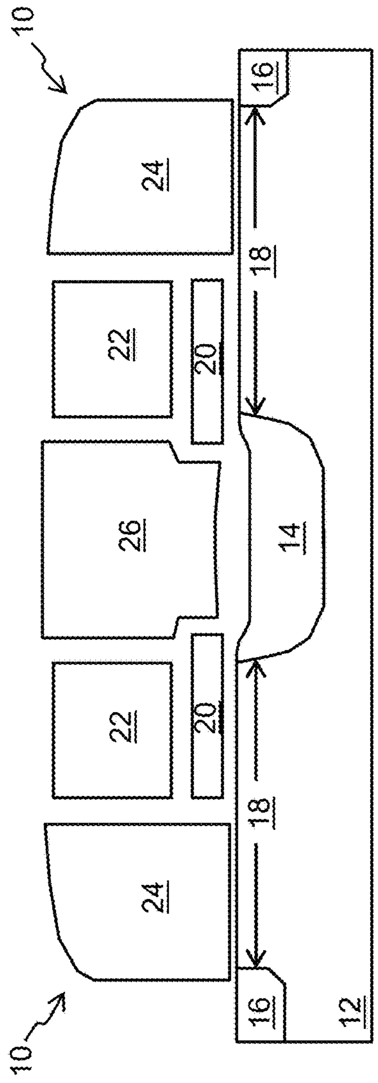
FIG. 1 (Prior Art)
FIG. 1 is a cross sectional view of a conventional pair of memory cells.
Figure 5:
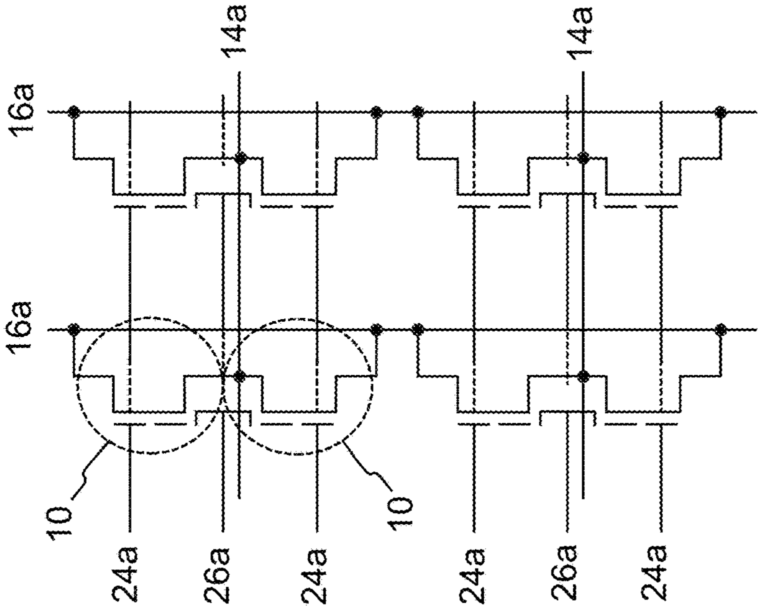
FIG. 5 (Prior Art)
FIG. 5 is a schematic and layout diagram of a conventional memory cell array of the memory cells of FIG. 4.
Figure 4:
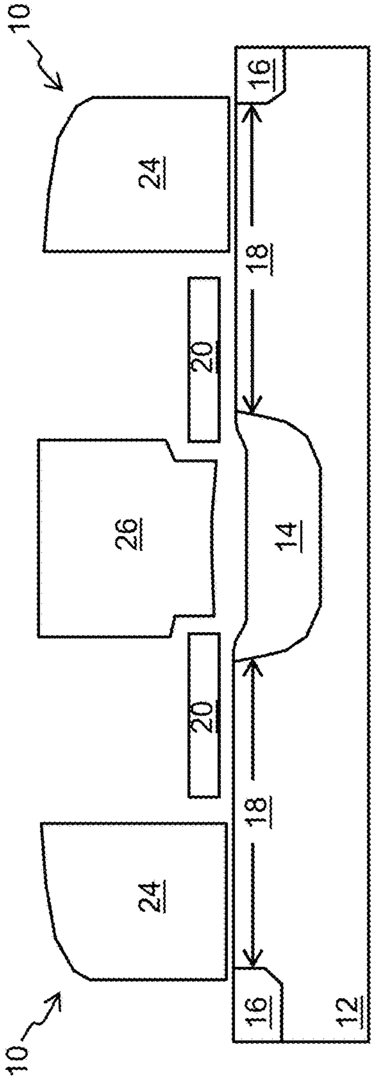
FIG. 4 (Prior Art)
FIG. 4 is a side cross sectional view of a conventional pair of memory cells.
Figure 7:
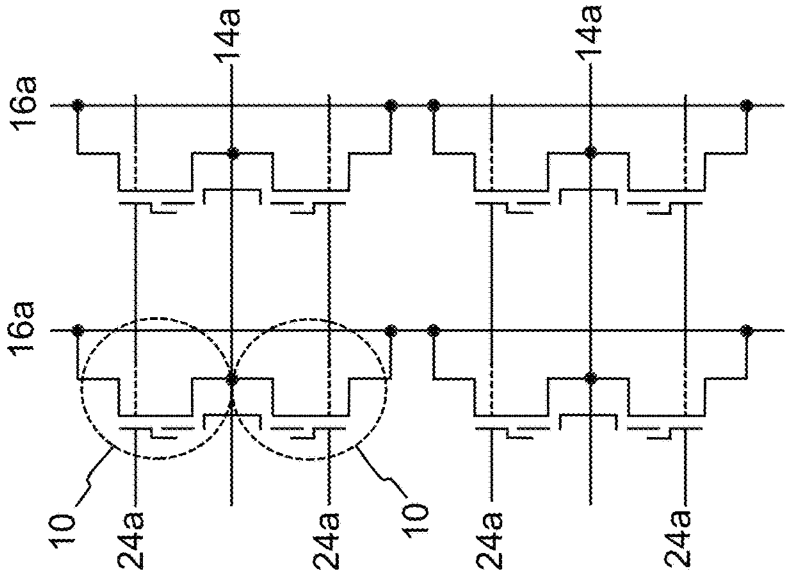
FIG. 7 (Prior Art)
FIG. 7 is a schematic and layout diagram of a conventional memory cell array of the memory cells of FIG. 6.
Figure 6:
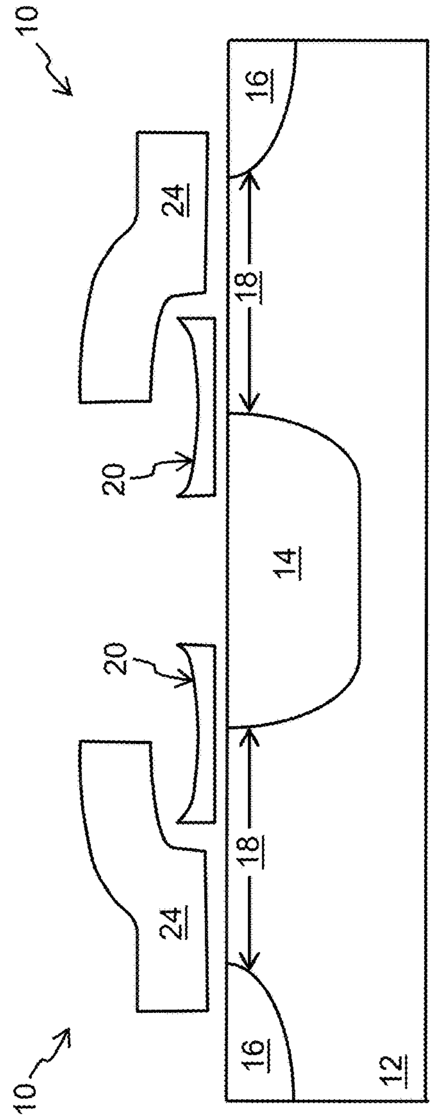
FIG. 6 (Prior Art)
FIG. 6 is a side cross sectional view of a conventional pair of memory cells.
Figure 8:
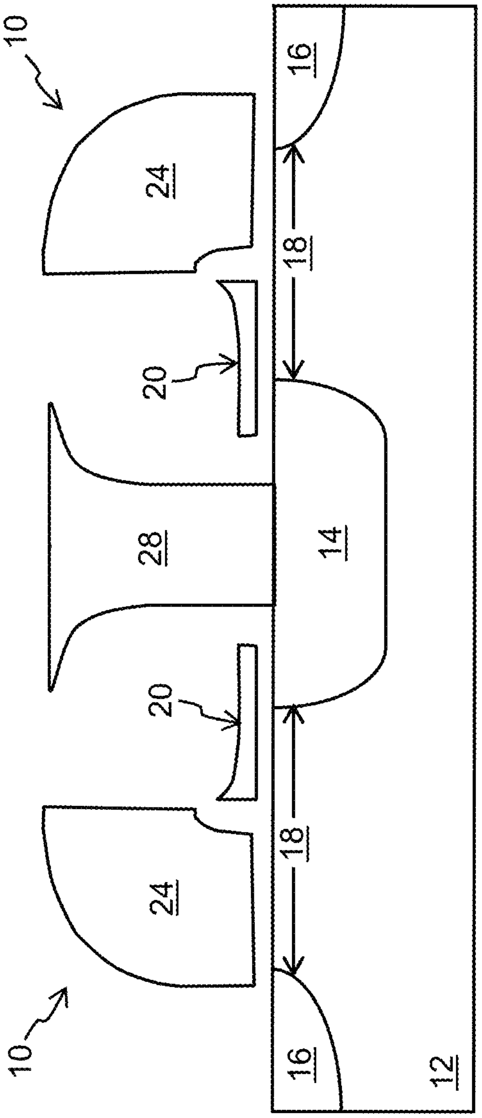
FIG. 8 (Prior Art)
FIG. 8 is a side cross sectional view of a conventional pair of memory cells.
Figure 9:
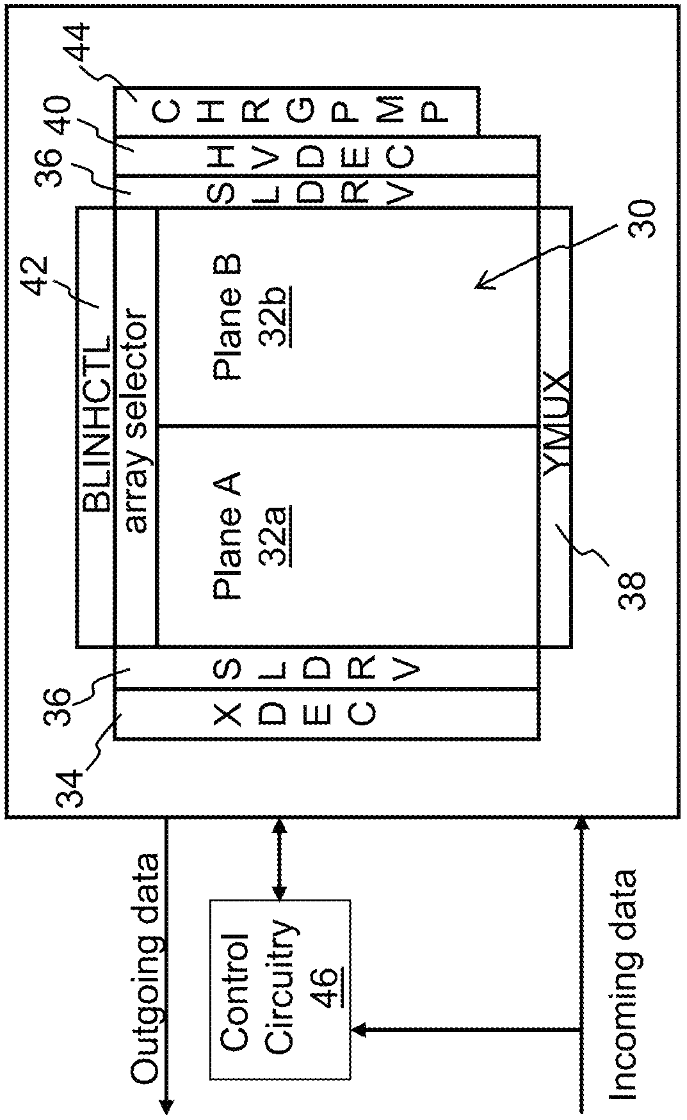
FIG. 9 is a diagram illustrating components of a semiconductor device.

The present examples illustrate dual read mode operation of memory cells in a semiconductor device. The dual read mode operation can be implemented as part of control circuitry 46, which controls the various device elements for a memory array, which can be better understood from the architecture of an example semiconductor device as illustrated in FIG. 9. The semiconductor device includes an array 30 of the split gate memory cells 10, which can be segregated into two separate planes (Plane A 32*a* and Plane B 32*b*). The split gate memory cells 10 can be of the type shown in FIG. 1, 4, 6 or 8, arranged in a plurality of rows and columns in the semiconductor substrate 12 as illustrated in FIG. 2, 5 or 7, and thus formed on a single chip. It should be noted however, that the memory cells 10 can be any memory cell that includes a floating gate, including a stacked gate memory cell where the floating gate extends over and controls the conductivity of the entirety of the channel region. Adjacent to the array 30 of split gate memory cells 10 are an address decoder 34 (e.g., XDEC), source line drivers 36 (e.g., SLDRV), a column decoder 38 (e.g., YMUX), a high voltage row decoder 40 (e.g., HVDEC), a bit line controller 42 (e.g., BLINHCTL), and a charge pump 44 (e.g., CHRGPMP), which are used to decode addresses and supply the various voltages to the various gates and regions of the split gate memory cells 10 during read, program, and erase operations for selected split gate memory cells 10 of the array 30, under the control of the control circuitry 46. Column decoder 38 includes a sense amplifier containing circuitry for measuring the currents on the bit lines during a read operation. Control circuitry 46 controls the various device elements to implement each operation (program, erase, read) on selected split gate memory cells 10 of the array 30 as described herein. Control circuitry 46 operates the semiconductor device to program, erase and read the selected split gate memory cells 10 of the array 30. As part of these operations, the control circuitry 46 can be provided with access to incoming data which is user data to be programmed to the selected split gate memory cells 10 of the array 30, along with program, erase and read commands provided on the same or different lines. Data read from the array 30 (i.e., from selected split gate memory cells 10 of the array 30) is provided as outgoing data.

The dual read mode operation involves the control circuitry 46 implementing such operation in program, erase and read operations. Thus, control circuitry 46 may be loaded with software, i.e. non-transitory electronically readable instructions, or firmware, or can consist of respective circuits, or any combination thereof, to perform the methods described herein. Control circuitry 46 may be implemented by a microcontroller, dedicated circuitry, a processor, a general purpose processor running firmware or software, or a combination thereof. Control circuitry 46 can also work under the control of an off chip controller or control signals.

The dual read mode semiconductor device begins by programming an incoming set of data twice, once to a first area of the memory array (e.g., to first area memory cells as word(s) or sector(s) in the first area of the memory array) in matching form, and again to a second area of the memory array (e.g., to second area memory cells as word(s) or sector(s) in the second area of the memory array) in complementary form, so that there are two images of the same data stored in the memory array (a first image in matching form and a second image in complementary form). Each data corresponds to a different program state (i.e., every data has a unique corresponding program state). Matching form means the program state of the memory cell storing the data matches the data (i.e., the program state used to store the data is the program state that corresponds to the data). Specifically, for first area memory cells, each data bit corresponding to a particular program state is stored in the corresponding first area memory cell at that program state. For instance, using the program states in the example of FIG. 3, data 01 corresponds to program state 01, data 00 corresponds to program state 00, data 10 corresponds to program state 10, and data 11 corresponds to program state 11. When stored in matching form, data corresponding to the program state 01 (i.e., the highest program state) is stored in the corresponding first area memory cell by programming that memory cell to the program state 01 (so that the memory cell will exhibit a read current RC less than first reference read current REF A). Similarly, data corresponding to the program state 00 is stored in the corresponding first area memory cell by programming that memory cell to the program state 00 (so that the memory cell will exhibit a read current RC between first reference read current REF A and second reference read current REF B). Data corresponding to the program state 10 is stored in the corresponding first area memory cell by programming that memory cell to the program state 10 (so that the memory cell will exhibit a read current RC between second reference read current REF B and third reference read current REF C). Finally, data corresponding to the program state 11 is stored in the corresponding first area memory cell by programming that memory cell to the program state 11 (i.e., erasing the memory cell, so that the memory cell will exhibit a read current RC greater than third reference read current REF C).

Complementary form means the program state of the memory cell storing the data does not match the data. Specifically, every program state has a corresponding complimentary program state. Therefore, for second area memory cells, data corresponding to a particular program state is stored in the corresponding second area memory cell at a different, complementary program state than the program state corresponding to the data. For instance, again using the program states in the example of FIG. 3, data corresponding to the program state 01 can be stored in the corresponding second area memory cell by programming that memory cell to a complementary program state 10 (i.e., different from, and not matching, program state 01). Data corresponding to the program state 00 is stored in the corresponding second area memory cell by programming that memory cell to the complimentary program state 11 (i.e., different from, and not matching, program state 00). Data corresponding to the program state 10 is stored in the corresponding second area memory cell by programming that memory cell to the complimentary program state 01 (i.e., different from, and not matching, program state 10). Finally, data corresponding to the program state 11 is stored in the corresponding second area memory cell by programming that memory cell to the complimentary program state 00 (i.e., different from, and not matching, program state 11). In this example, complementary program states can be determined by changing all the logic state zeros to ones, and all the logic state ones to zeros. In this particular example, for any given pair of matching and complementary program states, the two program states are not adjacent to each other.

Figure 3:
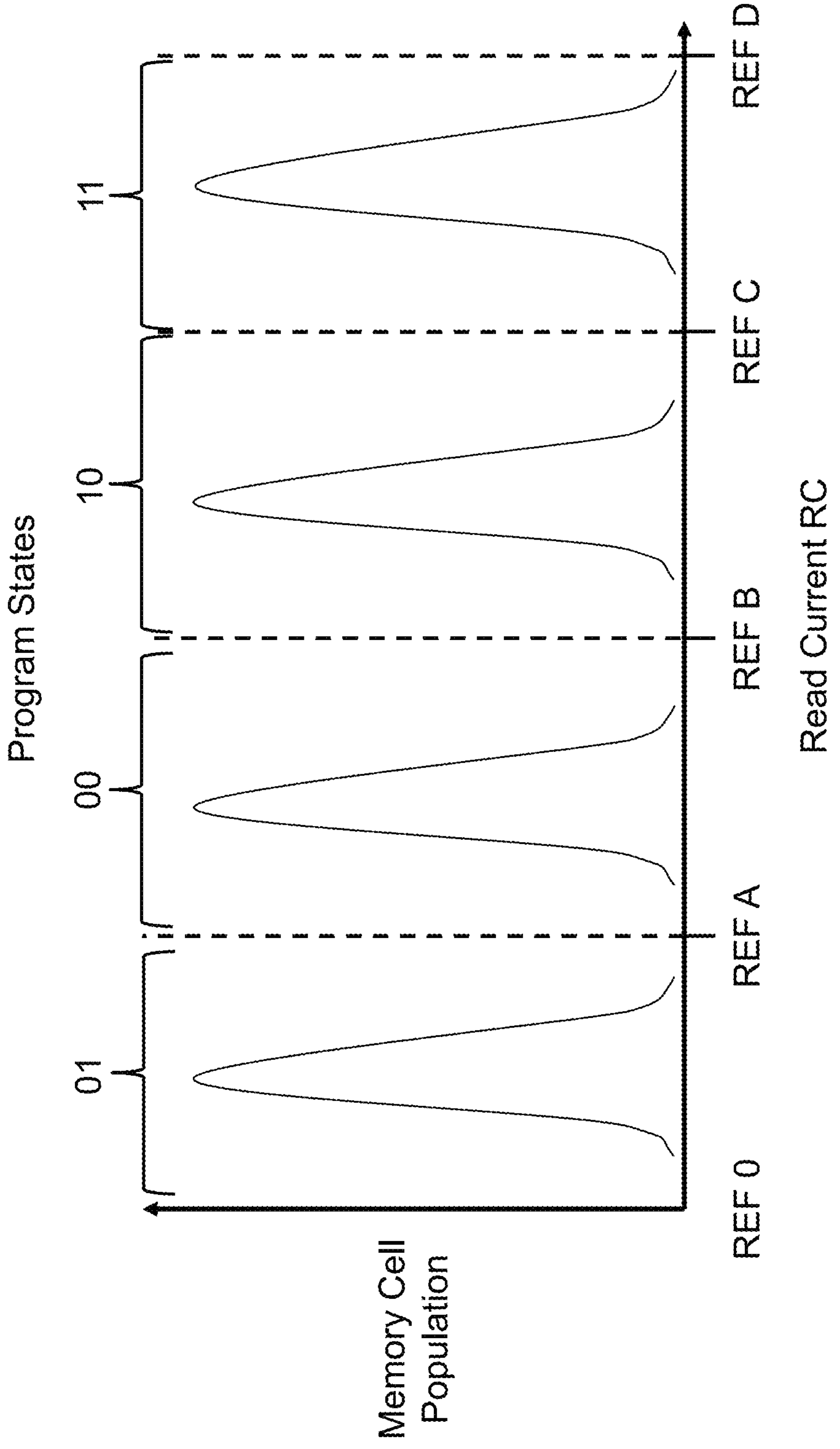
FIG. 3 is a diagram illustrating program state distributions as a function of read current RC.
Figure 10:
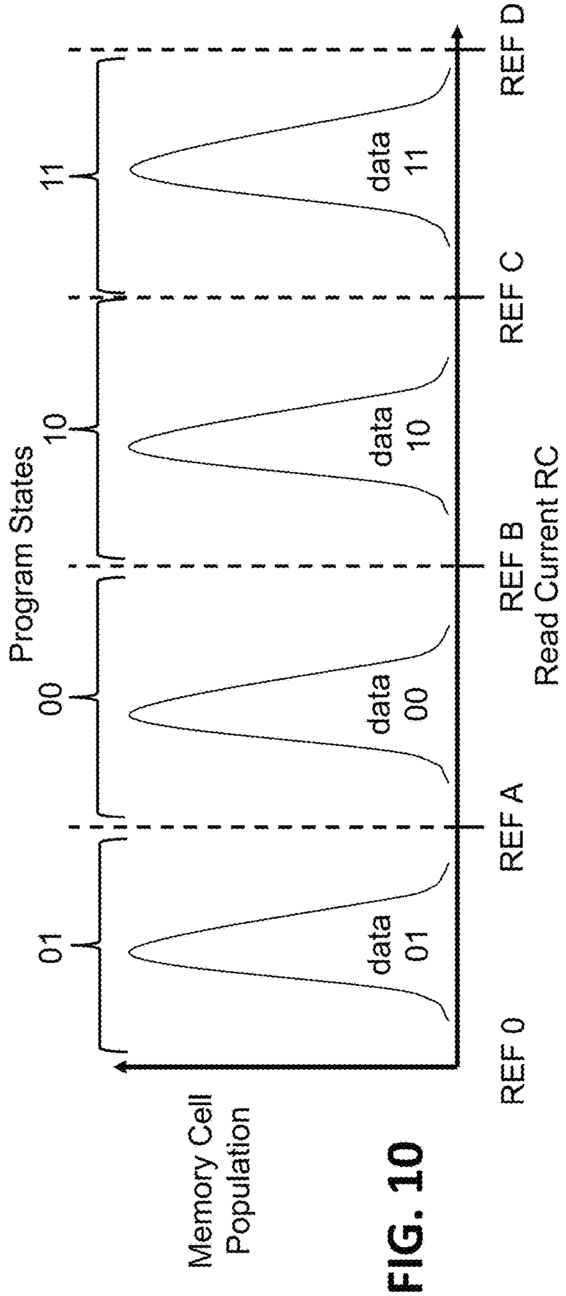
FIG. 10 is a diagram illustrating program state distributions for various data stored in matching form as a function of memory cell read current RC.
Figure 11:
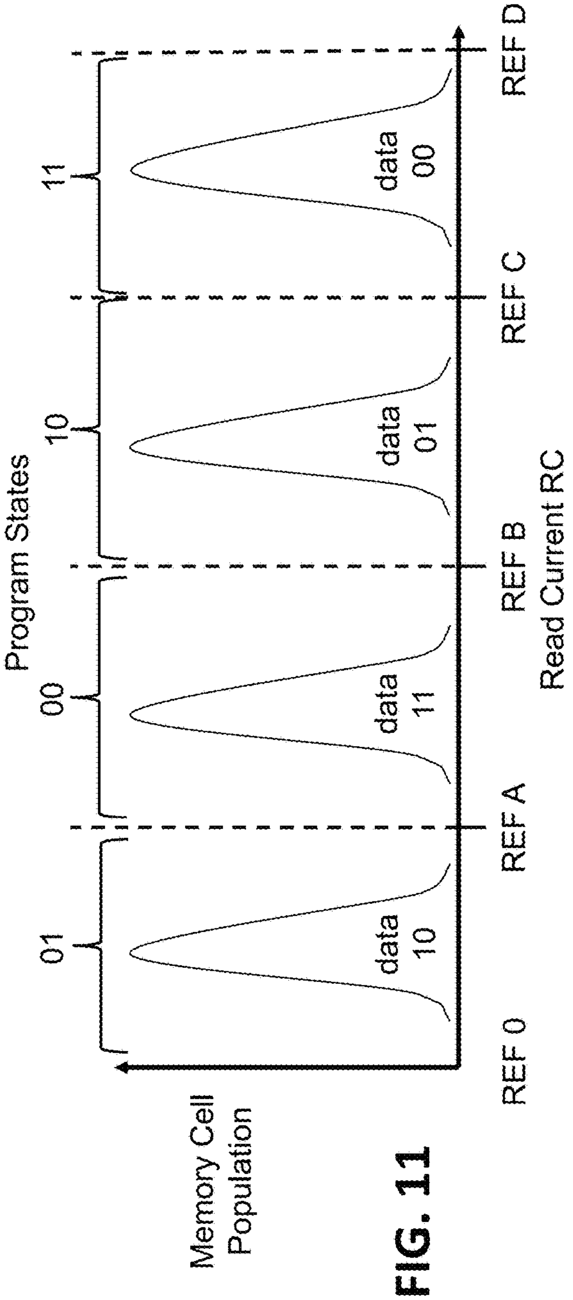
FIG. 11 is a diagram illustrating program state distributions for various data stored in complimentary form as a function of memory cell read current RC.

FIGS. 10-11 illustrate the matching and complimentary program states for data stored in the first and second areas in the memory array for the example program states of FIG. 3. Specifically, FIG. 10 illustrates the program states of the first area memory cells storing a first copy (image) of data in matching form. In the first area, data corresponding to the 01 programming state (i.e., data 01) is stored in memory cells in the 01 programming state. Data 00 is stored in memory cells in the 00 programming state. Data 10 is stored in memory cells in the 10 programming state. Finally, data 11 is stored in memory cells in the 11 programming state. In contrast, FIG. 11 illustrates the programming states of the second area memory cells storing a second copy (image) of the same data but in complimentary form. Data corresponding to the 01 programming state (i.e., data 01) is stored in memory cells in the 10 programming state. Data 00 is stored in memory cells in the 11 programming state. Data 10 is stored in memory cells in the 01 programming state. Finally, data 11 is stored in memory cells in the 00 programming state. Therefore, when data is stored by the semiconductor device, a first area memory cell is programmed to a first program state, and a second area memory cell is programmed to a second program state, where the second program state is different than the first program state.

Figure 12:
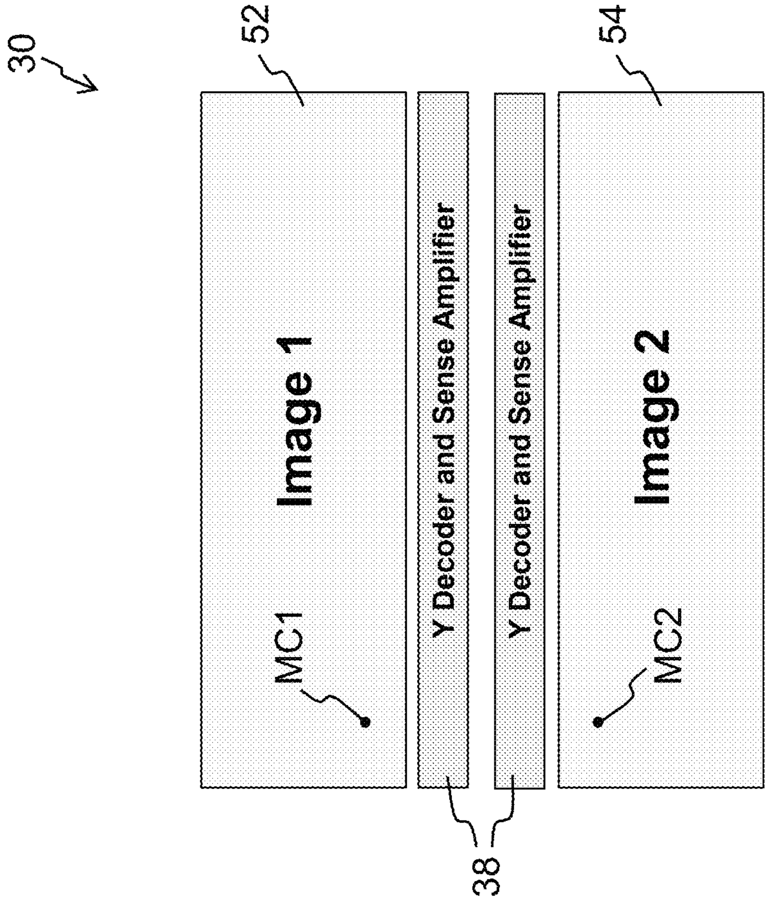
FIG. 12 is a diagram illustrating the first and second areas of the memory array

Each first area memory cell has a counterpart second area memory cell, so any data stored in a first area memory in matching form is also stored in a second area memory cell in complementary form, where the first area memory cell and the second area memory cell are counterparts to each other. For example, if data 01 is stored in a first area memory cell MC1 in matching form (i.e., the 01 program state is used to store the data 01), then the data 01 is stored in a counterpart second area memory cell MC2 in complimentary form (i.e., the 10 program state is used to store the data 01 in the counterpart second area memory cell). FIG. 12 illustrates an example of a memory array having a first area 52 and a second area 54, where the memory cells in the first area 52 store Image 1 of the data (in matching form) and the memory cells in the second area 54 store Image 2 of the data (in complimentary form). Preferably, the first and second areas 52, 54 have symmetrical layout and positioning to match their performance (e.g., similar layout, parasitic resistance, capacitance and leakage). For example, a first area memory cell MC1 and a second area memory cell MC2 that are counterparts to each other can be similarly located in their respective areas (i.e., similar positioning in terms of row and column).

Reading data from the memory device is performed in a first read mode, which involves comparing the read currents RC of two counterpart memory cells to each other, and to at least one of the reference read currents REF, as opposed to conventional read operations that only compare the read current RC from one memory cell to the reference read currents REF. For example, for logic data D1 stored in the memory array in matching form in first area memory cell MC1 and in complementary form in counterpart second area memory cell MC2, read operations are performed on both memory cells MC1 and MC1 to determine the read current RC1 of first area memory cell MC1 and the read current RC2 of second area memory cell MC2. The determination of logic data D1 is made by the following comparisons in a first determination example:

Logic data D1 determined as data 00 if: RC2>RC1>REF A;

Logic data D1 determined as data 11 if: RC1>RC2>REF A;

Logic data D1 determined as data 01 if: RC2>REF A>RC1;

Logic data D1 determined as data 10 if: RC1>REF A>RC2;

Else, logic data D1 is determined to be invalid.

The advantage of this read operation method is that instead of comparing a memory cell read current RC to one or two reference read currents REF that may be close to the read current distribution of the memory cell, the memory cell read currents RC from two counterpart memory cells (which will have significantly different read currents RC) are compared to each other and to just one reference read current. Specifically, the first mode read operation involves reading the first area memory cell to determine a first read current through the first area memory cell, reading the second area memory cell to determine a second read current through the second area memory cell, and comparing the first read current, the second read current and one of the reference read currents to each other. This read operation method more accurately determines logic data correctly even if there is moderate drift in the read current RC of either or both of the counterpart memory cells MC1, MC2. For example, if the first area memory cell storing 00 data suffers enough charge loss such that its read current RC1 increases beyond reference read current REF B, it would be improperly determined to be 10 data if only this memory cell is considered in a read operation. However, this improper determination is avoided by also requiring that the counterpart second area memory cell storing the 00 data have a read current RC2 greater than RC1. In this example, even with upward drift of reference read current RC1 for the first area memory cell, read current RC2 of the second area memory cell is greater than RC1 for data 00 but not data 10. Therefore, considering the two counterpart memory cells together, data 00 is properly identified in a read operation even with the upward drift of read current RC1 for the memory cell in the first area. The same would be true whether or not there was similar upward drift of read current RC2.

This read operation method also more accurately determines the logic data as stored in the two counterpart memory cells is invalid due to significant errors in the read current RC of either or both of the counterpart memory cells MC1, MC2 (e.g., through a programming error or a faulty memory cell). For example, if the read current RC1 for the first area memory cell and the read current RC2 for the second area memory cell are both less than reference read current REF A, then none of the above criteria are met for any of the four logic data, and the logic data should be deemed invalid.

In another example of a first read mode, for logic data D1 stored in the memory array in matching form in first area memory cell MC1 and in complementary form in counterpart second area memory cell MC2, the determination of logic data D1 is made by making the following comparisons in a second determination example:

- Logic data D1 determined as data 00 if: RC2>REF C>RC1;
- Logic data D1 determined as data 11 if: RC1>REF C>RC2;
- Logic data D1 determined as data 01 if: REF C>RC2>RC1;
- Logic data D1 determined as data 10 if: REF C>RC1>RC2;

Else, logic data D1 is determined to be invalid.

The second determination example uses reference read current REF C instead of reference read current REF A when comparing read currents RC1 and RC2 to determine logic data D1 stored in counterpart memory cells MC1 and MC2.

In yet another example of a first read mode, for logic data D1 stored in the memory array in matching form in first area memory cell MC1 and in complementary form in counterpart second area memory cell MC2, the determination of logic data D1 is made by making the following comparisons in a third determination example:

- Logic data D1 determined as data 00 if:
  - RC2>REF C>RC1>REF A, or
  - RC2>RC1>REF C;
- Logic data D1 determined as data 11 if:
  - RC1>REF C>RC2>REF A, or
  - RC1>RC2>REF C;
- Logic data D1 determined as data 01 if:
  - REF C>RC2>REF A>RC1, or
  - REF A>RC2>RC1;
- Logic data D1 determined as data 10 if:
  - REF C>RC1>REF A>RC2, or
  - REF A>RC1>RC2;

Else, logic data D1 is determined to be invalid.

The third determination example is more tolerant to read current drifts over time while still accurately determining the logic data D1, invalid or not.

In yet one more example of a first read mode, for logic data D1 stored in the memory array in matching form in first area memory cell MC1 and in complementary form in counterpart second area memory cell MC2, the determination of logic data D1 is made by making the following comparisons in a fourth determination example:

Where REF C>RC2>RC1>REF A:

- Logic data D1 is determined as data 00 if a read current downward drift probability for program state 11 is greater than a read current upward drift probability for program state 01; if not then logic data D1 is determined as data 01.

Where REF C>RC1>RC2>REF A:

- Logic data D1 is determined as data 11 if a read current downward drift probability for program state 11 is greater than a read current upward drift probability for program state 01; if not then logic data D1 is determined as data 10.

Where RC2>REF C>REF A>RC1:

- Logic data D1 is determined as data 00 if a read current downward drift probability for program state 00 is greater than a read current upward drift probability for program state 10; if not then logic data D1 is determined as data 01.

Where RC1>REF C>REF A>RC2:

- Logic data D1 is determined as data 11 if a read current downward drift probability for program state 01 is greater than a read current upward drift probability for program state 10; if not then logic data D1 is determined as data 10.

A read current downward drift probability for a given program state is the probability that the read current for a memory cell programmed to the given program state will drift down over time. A read current upward drift probability for a given program state is the probability that the read current for a memory cell programmed to the given program state will drift up over time. The fourth determination example takes into account multiple possible causes of read current drift. As stated above, the read current can drift up over time in case of charge loss (i.e., electrons leaking off the floating gate to adjacent regions). Read current can also drift up or down over time caused by movement or detrapping of electrons in the dielectric layers near the floating gate. For a given process technology, these read current drifts can exhibit predictable behavior to the point that read current downward drift probabilities and read current upward drift probabilities different program states can be estimated, empirically determined or otherwise known. For example, electron leakage happens in the direction toward neutralizing the floating gate charge, and leakage can be faster when the charge state of the floating gate is further away from the neutral state of the floating gate. Further, electron movement in dielectric layers can tend to only go in one direction. Therefore, for those process technologies where dominate mechanisms and behaviors of read current drift are known, the comparisons used to read data can include comparing a read current downward drift probability for one of the program states to a read current upward drift probability for another one of the program states, which can increase read accuracy.

A memory array configured to store data in both matching and complimentary forms in two areas of the memory array as set forth above has the additional advantage of allowing the data to be read from the memory array even while the data is being updated in the memory array. For example, one such application can be over the air updates to automobiles, where original data (software) stored in the memory array used to operate the automobile may require periodic updates without disabling the automobile. This can be implemented as follows. When the updated data begins to arrive, it can be stored in the area of the memory array that currently stores original data but in complimentary form (e.g., the second area in the above example). However, the updated data is stored in the second area of the memory in complimentary form.

During this portion of the update process, the second area of the memory array is unavailable for a first mode read operation, so any reading of the original data uses a second read mode in which conventional read operations are performed on the first area memory cells storing the original data by comparing memory cell read currents RC to the reference read currents only (not to any read currents RC of the second area memory cells). Using the example above, where the original data is stored in the first area memory cells in matching form, and RC1 represents the read current RC of one of the first area memory cells being read, a conventional read operation would involve making the following comparisons to determine the logic data D1 stored in that memory cell:

Logic data D1 determined as data 00 if: REF B>RC1>REF A;

Logic data D1 determined as data 11 if: RC1>REF C;

Logic data D1 determined as data 01 if: RC1<REF A;

Logic data D1 determined as data 10 if: REF C>RC1>REF B;

Else, logic data D1 is determined to be invalid.

This conventional read operation may not be as accurate as one that compares read currents RC from two complimentary memory cells, but it can suffice until the update process to the second area memory cells is completed.

After the updated data is stored in the second area of the memory array (in complimentary form), then this updated image becomes the new source for reading data in the second read mode from the memory array if needed while the update continues (by updating the data in the first area memory cells). However, given that the updated image in the second area memory cells is stored in complementary form, not matching form, the conventional read operation comparisons to the reference read currents will differ from that of the first area memory cells. Using the example above, where the updated data is stored in the second area memory cells in complimentary form, and RC2 represents the read current RC of one of the second area memory cells being read, a conventional read operation would involve making the following comparisons to determine the logic data D1 stored in that memory cell:

Logic data D1 determined as data 11 if: REF B>RC2>REF A;

Logic data D1 determined as data 00 if: RC2>REF C;

Logic data D1 determined as data 10 if: RC2<REF A;

Logic data D1 determined as data 01 if: REF C>RC2>REF B;

Else, logic data D1 is determined to be invalid.

The update process continues by updating the data stored in the first area so that it is fully complimentary to the updated data stored in the second area. This results in the first area storing the updated data in matching form, and the second area storing the updated data in complimentary form. At this point the update is complete, and read operations can revert back to the first read mode (that involves comparing the read currents RC1, RC2 of counterpart memory cells MC1, MC2 and one or more of the reference read currents REF).

The first read mode provides superior read performance and reliability. However, when the data is to be updated, at any given time during the update process, there is always one complete image of the data in either matching form or complimentary form to read from, which can always be read using conventional read operations in the second read mode (i.e., comparing memory cell read currents RC to reference read currents REF), until complimentary sets of the data are restored whereby the higher precision first read mode can be used (i.e., comparing memory cell read currents from counterpart memory cells and at least one of the reference read currents REF).

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit any claims. While the examples described herein include four program states (one of which is the erased state), fewer or greater than four program states can be used. Finally, the claims are comprising claims unless otherwise stated, and therefore "each" of a plurality of elements having a limitation does not preclude the inclusion of additional such elements lacking the limitation unless otherwise specifically claimed. It should be noted that reference herein to circuitry, or a module of circuitry, or the like, to perform or configured to perform an operation refers to the physical structure of the circuit (i.e., the capabilities of the circuitry as dictated by its structure), and does not refer to any method or actual use of the circuitry.

What is claimed is:

1. A method of operating a semiconductor device having a plurality of memory cells programmable to a plurality of program states, wherein each of the program states is associated with a range of read currents bounded by a pair of reference read currents, the method comprising:

storing data by:

programming a first memory cell of the plurality of memory cells to a first program state of the plurality of program states, and programming a second memory cell of the plurality of memory cells to a second program state of the plurality of program states, wherein the second program state is different than the first program state; and reading the data by:

reading the first memory cell to determine a first read current through the first memory cell, reading the second memory cell to determine a second read current through the second memory cell, and comparing the first read current, the second read current and a first one of the reference read currents to each other.

2. The method of claim 1, wherein the comparing includes determining that the first one of the reference read currents is less than the first read current and greater than the second read current.

3. The method of claim 1, wherein the comparing includes determining that the first one of the reference read currents is less than the first read current and the second read current.

4. The method of claim 3, wherein the comparing includes determining that the first read current is greater than the second read current.

5. The method of claim 1, wherein the comparing includes determining that the first one of the reference read currents is greater than the first read current and the second read current.

6. The method of claim 5, wherein the comparing includes determining that the first read current is greater than the second read current.

7. The method of claim 1, wherein the comparing includes comparing the first read current, the second read current, the first one of the reference read currents, and a second one of the reference read currents to each other.

8. The method of claim 7, wherein the comparing includes determining that the first one of the reference read currents is less than the first read current and greater than the second read current, and the second one of the reference read currents is less than the second read current.

9. The method of claim 7, wherein the comparing includes determining that the first one of the reference read currents is less than the first read current and greater than the second read current, and the second one of the reference read currents is greater than the first read current.

10. The method of claim 7, wherein the comparing includes comparing a read current downward drift probability for one of the program states to a read current upward drift probability for another one of the program states.

11. The method of claim 10, wherein the comparing includes determining that the first one of the reference read currents is less than the first read current and the second read current, and the second one of the reference read currents is greater than the first read current and the second read current.

12. The method of claim 10, wherein the comparing includes determining that the first read current is greater than the first one of the reference read currents and the second one of the reference read currents, and the second read current is less than the first one of the reference read currents and the second one of the reference read currents.

13. The method of claim 1, comprising:
- reading the data by:
  - reading the first memory cell to determine a third read current through the first memory cell, and
  - comparing the third read current to least one of the reference read currents.

14. The method of claim 13, comprising:
- reading the data by:
  - reading the second memory cell to determine a fourth read current through the first memory cell, and
  - comparing the fourth read current to least one of the reference read currents.

15. A semiconductor device, comprising:
- a plurality of memory cells programmable to a plurality of program states, wherein each of the program states is associated with a range of read currents bounded by a pair of reference read currents; and
- control circuitry to:
  - store data by:
    - program a first memory cell of the plurality of memory cells to a first program state of the plurality of program states, and
    - program a second memory cell of the plurality of memory cells to a second program state of the plurality of program states, wherein the second program state is different than the first program state; and
  - read the data by:
    - read the first memory cell to determine a first read current through the first memory cell,
    - read the second memory cell to determine a second read current through the second memory cell, and
    - compare the first read current, the second read current and a first one of the reference read currents to each other.

16. The semiconductor device of claim 15, wherein the comparison includes determine that the first one of the reference read currents is less than the first read current and greater than the second read current.

17. The semiconductor device of claim 15, wherein the comparison includes determine that the first one of the reference read currents is less than the first read current and the second read current.

18. The semiconductor device of claim 17, wherein the comparison includes determine that the first read current is greater than the second read current.

19. The semiconductor device of claim 15, wherein the comparison includes determine that the first one of the reference read currents is greater than the first read current and the second read current.

20. The semiconductor device of claim 19, wherein the comparison includes determine that the first read current is greater than the second read current.

21. The semiconductor device of claim 15, wherein the comparison includes compare the first read current, the second read current, the first one of the reference read currents, and a second one of the reference read currents to each other.

22. The semiconductor device of claim 21, wherein the comparison includes determine that the first one of the reference read currents is less than the first read current and greater than the second read current, and the second one of the reference read currents is less than the second read current.

23. The semiconductor device of claim 21, wherein the comparison includes determine that the first one of the reference read currents is less than the first read current and greater than the second read current, and the second one of the reference read currents is greater than the first read current.

24. The semiconductor device of claim 21, wherein the comparison includes compare a read current downward drift probability for one of the program states to a read current upward drift probability for another one of the program states.

25. The semiconductor device of claim 24, wherein the comparison includes determine that the first one of the reference read currents is less than the first read current and the second read current, and the second one of the reference read currents is greater than the first read current and the second read current.

26. The semiconductor device of claim 24, wherein the comparison includes determine that the first read current is greater than the first one of the reference read currents and the second one of the reference read currents, and the second read current is less than the first one of the reference read currents and the second one of the reference read currents.

27. The semiconductor device of claim 15, wherein the control circuitry to:
- read the data by:

read the first memory cell to determine a third read current through the first memory cell, and compare the third read current to least one of the reference read currents.

28. The semiconductor device of claim 27, comprising: read the data by:

read the second memory cell to determine a fourth read current through the first memory cell, and compare the fourth read current to least one of the reference read currents.

* * * * *